United States Patent
Kang

(10) Patent No.: US 7,911,763 B2
(45) Date of Patent: Mar. 22, 2011

(54) METHOD FOR FORMING MIM IN SEMICONDUCTOR DEVICE

(75) Inventor: Myung-II Kang, Gyeonggi-do (KR)

(73) Assignee: Dongbu HiTek Co., Ltd., Seoul (KR)

( * ) Notice: Subject to any disclaimer, the term of this patent is extended or adjusted under 35 U.S.C. 154(b) by 599 days.

(21) Appl. No.: 11/923,359

(22) Filed: Oct. 24, 2007

(65) Prior Publication Data

US 2008/0112108 A1    May 15, 2008

(30) Foreign Application Priority Data

Nov. 13, 2006  (KR) .......................... 10-2006-0111627

(51) Int. Cl.
    *H01G 4/005*    (2006.01)
(52) U.S. Cl. ...................... 361/303; 361/305; 361/321.1; 361/311; 361/313

(58) Field of Classification Search .................. 361/303, 361/301.2, 306.2, 305, 301.4, 311–313, 306.1, 361/306.3, 328–330; 438/395, 396
See application file for complete search history.

(56) References Cited

U.S. PATENT DOCUMENTS

| | | | | |
|---|---|---|---|---|
| 6,380,079 B1 * | 4/2002 | Lee | ............................... | 438/675 |
| 6,452,779 B1 * | 9/2002 | Adler et al. | ................ | 361/306.3 |
| 6,466,427 B1 * | 10/2002 | Chen | .......................... | 361/306.3 |
| 6,717,202 B2 * | 4/2004 | Sugawara et al. | ............. | 257/309 |
| 6,734,489 B2 * | 5/2004 | Morimoto et al. | ............ | 257/306 |
| 7,436,016 B2 * | 10/2008 | Barth et al. | .................... | 257/306 |

* cited by examiner

*Primary Examiner* — Nguyen T Ha
(74) *Attorney, Agent, or Firm* — Sherr & Vaughn, PLLC

(57) ABSTRACT

The present invention relates to a semiconductor device, and more particularly to a method for forming a metal/insulator/metal (MIM). The method comprises the steps of: forming a metal wiring surrounded by the inter-metal dielectric film; forming a plurality of insulating film on the metal wiring in sequence; and forming a metal barrier film on the insulating film, whereby the insulating film functioning as a buffer film can mitigate the stress between the films.

7 Claims, 2 Drawing Sheets

METHOD FOR FORMING MIM IN SEMICONDUCTOR DEVICE

Figure 1:
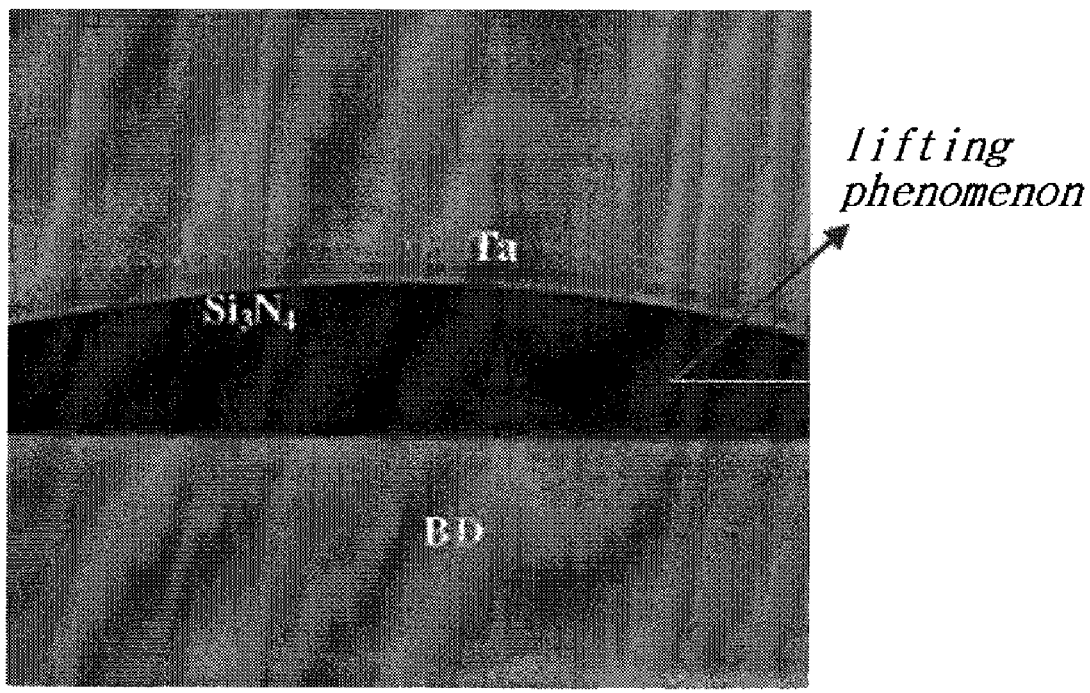

The present application claims priority under 35 U.S.C. 119 to Korean Patent Application No. 10-2006-0111627 (filed on Nov. 13, 2006), which is hereby incorporated by reference in its entirety.

BACKGROUND

As an insulator of a capacitor, $SiO_2/Si_3N_4$ based dielectric materials have generally been used. The capacitor may be categorized in accordance with the type of electrode material used, such as a poly/insulator/poly (PIP) capacitor or a metal/insulator/metal (MIM) capacitor.

A thin film type capacitor such as the PIP capacitor or the MIM capacitor does not correlate to a bias, unlike a metal oxide semiconductor (MOS) capacitor or a junction capacitor. Therefore, thin film type capacitors have mainly been used for an analog product requiring a precision capacitor.

When compared to the PIP capacitor, the MIM capacitor has a disadvantage in that it is difficult to increase the capacitance per a unit area. However, the MIM capacitor exhibits better characteristics in terms of voltage coefficient of capacitance (VCC) and temperature coefficient of capacitance (TCC), and thus, is suitable for manufacture in a precision analog device.

As integration of semiconductor devices increase, a metal/insulator/semiconductor (MIS) capacitor cannot obtain desired capacitance due to a low insulator being formed between an insulator and a polysilicon film. Accordingly, there is an ever increasing demand for the MIM capacitor to replace the MIS capacitor.

Capacitors using silicon oxide ($SiO_2$) or silicon nitride (SiN) insulators are popular, and may be produced using plasma enhanced chemical vapor deposition (PECVD). A capacitance density of about 1 $fF/um^2$ can be obtained using such insulators.

Development of semiconductor technology has required increased integration and operation speed. In order to meet such demands, a need exists for material development and finer process technology. For semiconductor devices of 90 nm or less, a semiconductor device having increased operation speed can be manufactured by reducing an RC delay using black diamond (BD) having k~2.9 and SiC, which is a low-K material.

However, in a process for forming the MIM, a problem may occur due to the use of a dielectric material made of a black-diamond material as an inter-metal dielectric (IMD) film. As illustrated in example FIG. 1, occurrence of a lifting phenomenon due to large stress differences between tantalum (Ta) that is a copper (Cu) barrier material and silicon nitride (SiN) that is an MIM insulator material used as a semiconductor wiring and a MIM flat panel and a BD material used as the inter-metal dielectric material so that adhesion between the inter-metal dielectric film and the insulator is degraded. Furthermore, the BD may raise the degradation phenomenon of the adhesion in a dry etch and a copper planarization process to increase the lifting phenomenon, having a large effect on the degradation of the reliability and yield of the device.

SUMMARY

Embodiments relate to a method for forming an MIM in a semiconductor device which prevents a lifting phenomenon by reducing stress between MIM films.

Embodiments relate to a method for forming an MIM in a semiconductor device including at least one of the following steps: forming a metal wiring surrounded by an inter-metal dielectric film; sequentially forming a plurality of insulating films on and/or over the metal wiring; and forming a metal barrier film on and/or the plurality of insulating films.

Embodiments relate to a method for forming an MIM in a semiconductor device including at least a step of forming a plurality of insulating films including a first insulating film which mitigates the stress difference between the inter-metal dielectric film and the second insulating film and also mitigates the stress difference between the inter-metal dielectric film and the metal barrier film.

DRAWINGS

Figure 2:
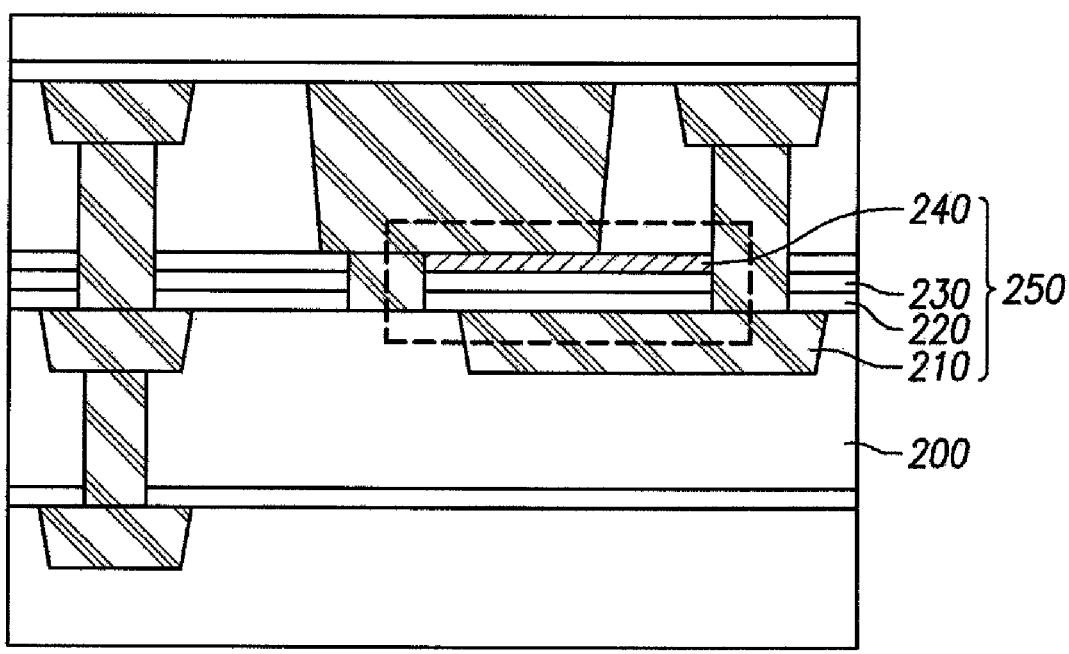
Figure 3:
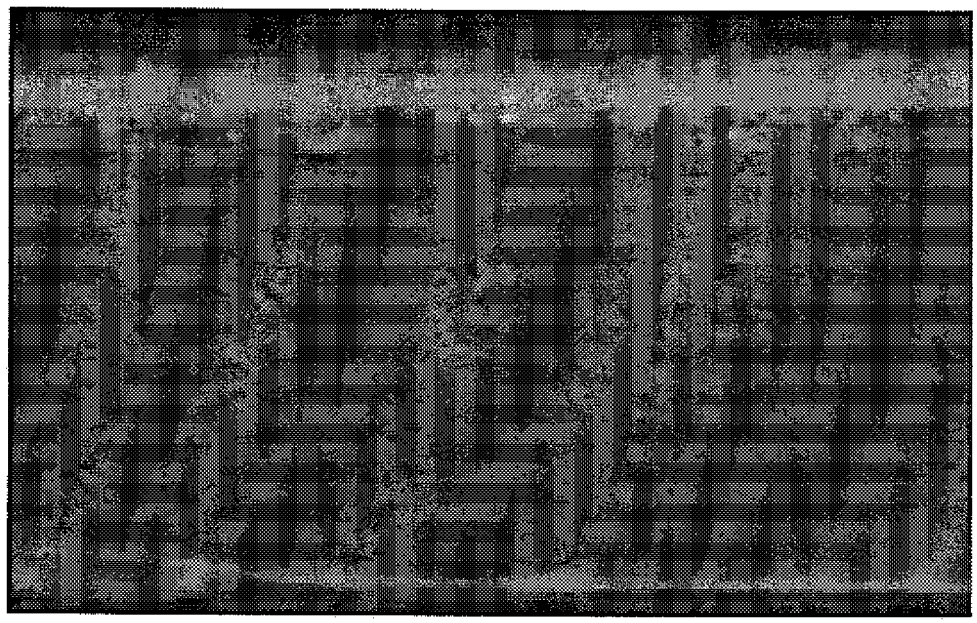

FIG. 1 is a scanning electron microscope (SEM) image showing a problem of a lifting phenomenon generated in a process for forming an MIM according to the related art; and FIG. 2 is a cross-sectional view for explaining a method for forming an MIM of a semiconductor device according to the embodiment of the present invention; and FIG. 3 is a scanning electron microscope (SEM) image showing a cross section of the MIM structure formed according to the embodiment of the present invention.

DESCRIPTION

As illustrated in example FIG. 2, metal wirings 210 surrounded by inter-metal dielectric film 200 can be electrically connected through a contact provided in a multi-layer form. Metal wirings 210 may have a thickness of between 0.8 to 1.0 um.

The dielectric constant of inter-metal dielectric film 200 can be 2.9 and may have an expansion stress of 9.6E8 $dyn/cm^2$. Inter-metal dielectric film 200 can be composed of a black-diamond (BD) material having a thickness of between approximately 1.8 to 2. um.

First insulating film 220 and second insulating film 230 can be sequentially formed on and/or over metal wiring 210. First insulating film 220 may be composed of an oxide-based material and have a compressive stress of between approximately −2.49E8 to −6.49E8 $dyn/cm^2$ in order to prevent occurrence of a lifting phenomenon. First insulating film 220 can be composed of an undoped silicate glass (USG) having a compressive stress of −4.49E8 $dyn/cm^2$. First insulating film 220 may have a thickness of between approximately 550 to 650 Å.

Second insulating film 230 can be composed of SiN or an oxide-based material having a compressive stress of −1.32E9 $dyn/cm^2$ and a thickness of between approximately 650 to 750 Å. A large stress difference between second insulating film 230 and inter-metal dielectric film 200 is generated.

Barrier metal film 240 of the upper metal wiring can be formed on and/or over second insulating film 230. Barrier metal film 240 can be composed of any one of a tantalum (Ta) or titanium (Ti) based material having a compression stress that is larger than that of second insulating film 230. Barrier metal film 240 may have a compressive stress of approximately −2.09E10 $dyn/cm^2$ and a thickness of between approximately 950 to 1050 Å. As a result, the stress difference generated between inter-metal dielectric film 200 and metal barrier film 240 is larger than that generated between inter-metal dielectric film 200 and second insulating film 230.

Accordingly, first insulating film 220, second insulating 230, and barrier metal film 240 can be formed on and/or metal wiring 210 to form MIM 250 structure. In order to overcome the poor adhesive in MIM structures due to large stress differences between the MIM 250 films, first insulating film 220 can serve as a buffer film that prevents a lifting phenomenon between second insulating film 230 and inter-metal dielectric film 200. Second insulating film 230 can serve as an insulator of MIM 250.

After forming MIM 250 capacitor, a process for forming an upper structure including the multi-layer metal wiring can be performed to form a predetermined semiconductor device.

The numerical value of the stress between MIM films is illustrated in Table 1.

TABLE 1

| Type of Film | Stress(dyn/cm$^2$) | Type of stress |
|---|---|---|
| Black Diamond (BD) | 9.6E8 | Expansive stress |
| Undoped Silicate Glass (USG) | −4.49E8 | Compressive stress |
| SiN | −1.32E9 | Compressive stress |
| Ta | −2.09E10 | Expansive stress |

As illustrated in Table 1, the large stress difference between inter-metal dielectric film 200 formed of a BD material and having expansion stress and second insulating film 230 formed of a SiN material, used as the insulator of the MIM, and having compression stress is generated.

Barrier metal film 240 formed of a Ta-based material may have a compressive stress larger than second insulating film 230. Therefore, the larger stress difference between barrier metal film 240 and inter-metal dielectric film 200 formed of BD can be generated.

As illustrated in example FIG. 3, in order to prevent the lifting phenomenon generated between the films due to large stress differences, first insulating film 220 formed of a USG material and functioning as a buffer film can be formed on and/or over inter-metal dielectric film 200 formed of BD so that the stress between the MIM 250 films can be mitigated.

In accordance with embodiments, insulating films that significantly reduce the stress difference between the MIM films otherwise exhibiting large stress differences. Therefore, the adhesion property between the films is reinforced, making it possible to improve the reliability and yield of the semiconductor device.

Although embodiments have been described herein, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An apparatus comprising:
   an inter-metal dielectric film;
   a plurality of metal wirings formed in the dielectric film;
   a first insulating film formed over the metal wirings, wherein the first insulating film comprising at least one of an oxide-based material and undoped silicate glass;
   a second insulating film formed over the first insulating film, wherein the second insulating film comprising SiN; and
   a metal barrier film formed over the second insulating film.

2. The apparatus of claim 1, wherein the inter-metal dielectric film comprises a black-diamond material and the metal barrier film comprises any one of a tantalum (Ta) and titanium (Ti) based material.

3. The apparatus of claim 2, wherein the inter-metal dielectric film has a thickness of between approximately 1.8 to 2.2 um, the first insulating film has a thickness of between approximately 550 to 650 Å, the second insulating film has a thickness of between approximately 650 to 750 Å, and the barrier metal film has a thickness of between approximately 950 to 1050 Å.

4. The apparatus of claim 1, wherein the first insulating film comprises undoped silicate glass having and a thickness of between approximately 550 to 650 Å and a compressive stress of approximately −4.49E8 dyn/cm2.

5. The apparatus of claim 1, wherein the first insulating film comprises an oxide-based material having and a thickness of between approximately 550 to 650 Å and a compressive stress of between approximately −2.49E8 to −6.49E8 dyn/cm2.

6. The apparatus of claim 1, wherein the second insulating film comprises SiN having a compressive stress of approximately −1.32E9 dyn/cm2.

7. The apparatus of claim 6, wherein the barrier metal film has a compression stress larger than the compressive stress of the second insulating film.

* * * * *